United States Patent [19]

Derkits, Jr.

[11] Patent Number: 4,672,405
[45] Date of Patent: Jun. 9, 1987

[54] MULTIPLE QUANTUM WELL FREQUENCY MULTIPLIER CIRCUIT

[75] Inventor: Gustav E. Derkits, Jr., New Providence, N.J.

[73] Assignee: Bell Communications Research, Inc., Livingston, N.J.

[21] Appl. No.: 768,671

[22] Filed: Aug. 23, 1985

[51] Int. Cl.⁴ .................. H01L 29/205; H01L 29/92
[52] U.S. Cl. ........................................ 357/16; 357/4; 357/14
[58] Field of Search ................................ 357/4, 16, 14

[56] References Cited

U.S. PATENT DOCUMENTS

| | | | |
|---|---|---|---|
| 4,103,312 | 7/1978 | Chang et al. | 357/16 |
| 4,163,237 | 7/1979 | Dingle et al. | 357/16 |
| 4,163,238 | 7/1979 | Esaki et al. | 357/17 |
| 4,194,935 | 3/1980 | Dingle et al. | 148/175 |
| 4,205,331 | 5/1980 | Esaki et al. | 357/30 |
| 4,208,667 | 6/1980 | Chang et al. | 357/16 |
| 4,250,515 | 2/1981 | Esaki et al. | 357/16 |
| 4,395,722 | 7/1983 | Esaki et al. | 357/16 |

OTHER PUBLICATIONS

S. M. Sze, Physics of Semiconductor Devices, 2nd edition—Wiley, 1981—pp. 114-116.
Penfield and Rafuse, Varactor Applications—1962—Chapter 8.
T. C. L. G. Sollner et al., Quantum Well Oscillators (preprint).

Primary Examiner—Gene M. Munson
Attorney, Agent, or Firm—James W. Falk; Daniel R. McGlynn

[57] ABSTRACT

A frequency multiplier circuit for producing higher order harmonics of an input frequency is disclosed. The frequency multiplier circuit comprises a multiple quantum well semiconductor device which is used to couple energy from an input circuit tuned to the input frequency to an output circuit which is tuned to a desired higher order harmonic of the input frequency.

1 Claim, 4 Drawing Figures

MULTIPLE QUANTUM WELL FREQUENCY MULTIPLIER CIRCUIT

FIELD OF THE INVENTION

This invention relates to a frequency multiplier circuit for generating harmonics of an input frequency through the use of a multiple quantum well semiconductor device.

BACKGROUND OF THE INVENTION

An electronic circuit that produces an output frequency which is an integral multiple of the input frequency is known as a frequency multiplier One type of frequency multiplier uses the nonlinear capacitance of a semiconductor junction diode to couple energy from an input circuit which is tuned to a fundamental input frequency to an output circuit which is tuned to a desired harmonic of the input frequency. A semiconductor junction device which has a nonlinear capacitance is known as a varactor. The basic physics of the varactor is described in S. M. Sze, Physics of Semiconductor Devices, 2nd Edition, Wiley 1981, pp. 114-116. Such varactor based frequency multiplier circuits are widely used in parametric amplification, mixing, detection, and voltage variable tuning. Varactor based frequency multiplier circuits are disclosed in Penfield and Rafuse "Varactor Applications" published by MIT Press in 1962.

One drawback to varactor based frequency multiplier circuits is that it is difficult to use these circuits to generate higher order harmonics of the input frequency. The reason for this is that the varactor has a capacitance which is weakly nonlinear. When a weakly nonlinear device such as a varactor is driven with an input frequency $\omega_o$, the predominant output is the harmonic frequency $2\omega_o$. In order to generate higher order harmonics such as $3\omega_o$, $4\omega_o$ etc., complex circuit arrangements are needed to feed the $2\omega_o$ output back to the input. In order to generate the $5\omega_o$, $6\omega_o$, and $7\omega_o$ harmonics, the $3\omega_o$ and $4\omega_o$ harmonics must be fed back to the input. In general, the required feedback circuitry becomes more and more complicated as one goes to higher and higher harmonics of the input frequency. In addition, the complex feedback circuitry makes it difficult to change the multiple of the input frequency produced by the frequency multiplier circuit, as each individual multiple of the input frequency requires a different feedback circuit arrangement.

Accordingly, it is an object of the present invention to provide a frequency multiplier circuit which produces higher order harmonics of an input frequency without the use of complex feedback circuits. It is a further object of the present invention to provide a frequency multiplier circuit in which it is possible to adjust in a simple manner the multiple of the input frequency produced by the frequency multipler circuit.

SUMMARY OF THE INVENTION

The present invention is a frequency multiplier circuit which is designed to produce an output frequency which is a higher order harmonic of an input frequency. The frequency multiplier circuit uses a multiple quantum well semiconductor device to couple energy from an input circuit which is tuned to the input frequency to an output circuit which is tuned to the desired higher order harmonic of the input frequency. Unlike the varactor whose capacitance is weakly nonlinear, the multiple quantum well semiconductor device has a capacitance which is highly non-linear so that higher order harmonics predominate in the output signal. Thus, complex feedback circuitry is not needed to generate higher order harmonics of the input frequency.

A multiple quantum well structure comprises a first plurality of relatively narrow bandgap semiconductor layers and a second plurality of relatively wide bandgap semiconductor layers. The relatively wide bandgap layers are interleaved with and continuous with the relatively narrow bandgap layers. When the device is unbiased, the relatively wide bandgap layers should exhibit conduction and valence band steps sufficiently large so that electrons and holes accumulate in the narrow band gap layers. In other words, the steps in the conduction and valence bands serve to define quantum wells whose widths are coextensive with the narrow band gap layers. The quantum wells tend to confine charge carriers to the narrow bandgap layers. Typically, such multiple quantum well structures are implemented using III–IV compounds such as $Al_xGa_{1-x}AS$.

When a reverse bias voltage of appropriate magnitude is applied to the multiple quantum well device, the narrow bandgap layers become depleted. The narrow bandgap layers become depleted when the reverse bias voltage provides a sufficient electric field so that the charge carriers can escape from the quantum wells defined by the steps in the valence and/or conduction bands. The number of narrow bandgap layers which are depleted of charge carriers or accumulated with charge carriers at any given moment depends on the magnitude of the reverse bias voltage at that moment.

The frequency multiplication results from the successive sharp capacitance changes induced by successive charge carrier depletion and charge carrier accumulation in the quantum wells during each cycle of the input signal. The most predominant output harmonic depends on the total number of quantum wells successively depleted or accumulated during each cycle of the input signal. This number depends upon the amplitude of the input signal, the D.C. reverse bias voltage if any, and the quantum well spacing. By the most predominant output harmonic may be easily varied by varying the D.C. reverse bias voltage or the amplitude of the input signal so as to change the number of quantum wells which are depleted or accumulated in a cycle.

By using a multiple quantum well structure in a frequency multiplier circuit instead of a varactor two primary advantages may be achieved. First, higher order harmonics of the input frequency may be generated without the use of complex feedback circuitry. Second, the predominant output harmonic can be controlled to a significant extent merely by adjusting the magnitude of the D.C. reverse bias voltage or the amplitude of the sinosoidal input signal.

DETAILED DESCRIPTION

Figure 1:
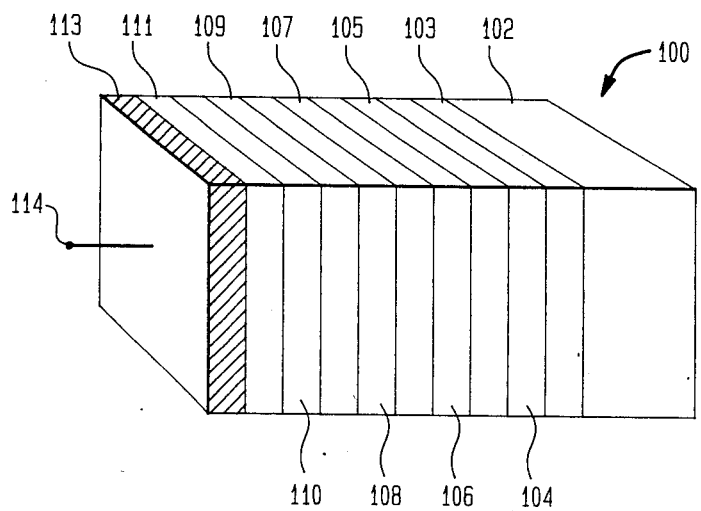
FIG. 1 schematically illustrates a multiple quantum well semiconductor device.

Turning to FIG. 1, a multiple quantum well device 100 implemented in the GaAs-AlGaAs materials system is illustrated. The multiple quantum well device illustratively comprises a semi-insulating weakly doped n-type GaAs substrate 102 and n-type GaAs layers 104, 106, 108 and 110. Interleaved between and contiguous with the GaAs layers 104, 106, 108 and 110 are layers 103, 105, 107, 109 and 111 which are illustratively formed from $Al_xGa_{1-x}A_x$ where x ranges from about 0.2 to about 0.35.

The layers 103 through 112 are deposited on the substrate 103 by means of a conventional technique such as molecular beam epitaxy or levitation vapor phase epitaxy. Typically, the layers 103 through 111 are each about 100 Angstroms thick and have an n-type dopant concentration of about $10^{17}$ cm$^{-3}$. A metal layer 113 is deposited contiguous with the GaAs layer 112 so as to form a schottky barrier. A bias voltage may be applied to the multiple quantum well device 100 by means of the lead 114. In alternative embodiments, instead of using the GaAs-AlGaAs materials systems, the multiple quantum well structure 100 may be formed using the GaAs-AlGaAsP, InP-InGaAsP, InP-InGaSb, InAs-GaAsSb or InGaP-GaAs materials systems.

Figure 2:
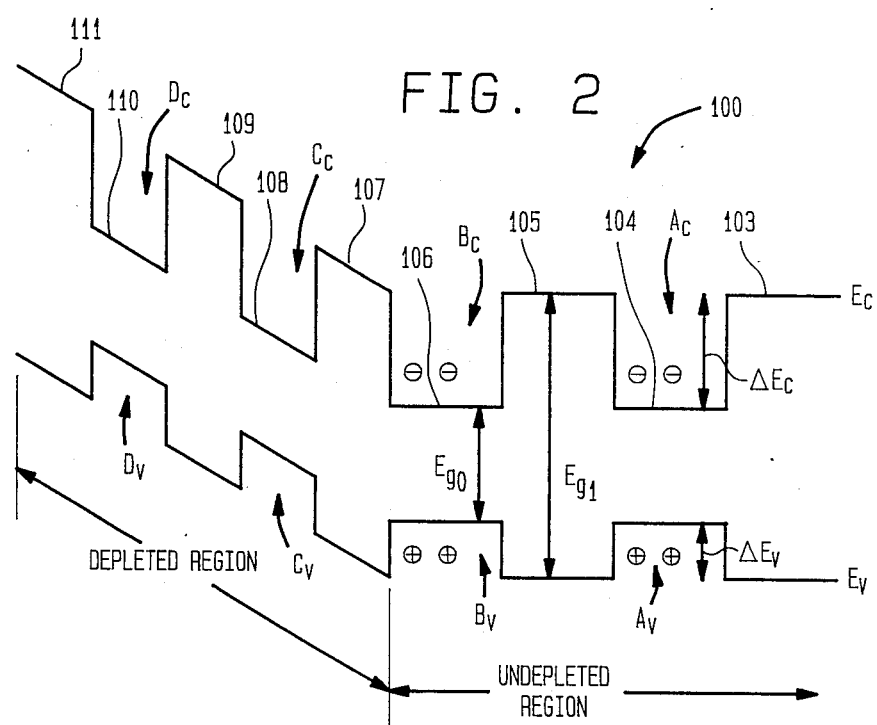
FIG. 2, shows the band diagram of the quantum well semiconductor device of FIG. 1.

The band structure of the multiple quantum well structure is shown in FIG. 2. The conduction band energy is designated $E_c$ and the valence band energy is designated $E_v$. The $Al_xGa_{1-x}As$ layers 103, 105, 107, 109 and 111 are the wide bandgap layers and the GaAs layers 104, 106, 108 and 110 are the narrow band gap layers. The bandgap $Eg_0$ of GaAs is about 1.42 ev, and the bandgap $Eg_1$ of $Al_xGa_{1-x}As$ ranges from 1.8 ev when x is 0.2 to about 2.1 ev when is about 0.35. In FIG. 2 the step in the conduction band is designated $\Delta E_c$ and the step in the valence band is designated $\Delta E_v$. When x is equal to 0.35, $\Delta E_c$ is about 0.42 ev and $\Delta E_c$ is about 0.28 ev. The relationship between the bandgap energies is such that $Eg_1 = Eg_0 + \Delta E_c + \Delta E_v$. The band structure of the AlGaAs materials system is discussed in Heterostructure Lasers by H. C. Casey, Jr. and M. B. Panish, Academic Press N.Y. 1978.

The steps in the valence and conduction bands serve to define quantum wells in both the valence bands and the conduction band. In FIG. 2 four quantum wells are shown in the conduction band. These wells are designated $A_c$, $B_c$, $C_c$ and $D_c$. Four quantum wells are also present in the valence band. These wells are designated $A_v, B_v, C_v, D_v$. The quantum wells $A_c, A_v$ are coextensive with the narrow bandgap layer 104, the quantum wells $B_c, B_v$ are coextensive the narrow bandgap layer 108, the quantum wells $C_c, C_v$ are coextensive with the narrow bandgap layer 108, and the quantum wells $D_c, D_v$ are coextensive with the narrow bandgap layer 110.

FIG. 2 shows the band structure of the multiple quantum well structure 100 when a reverse bias voltage is applied thereto by means of lead 114 and metallic layer 113. Depending on the magnitude of the reverse bias voltage a certain portion of the device 110 will be depleted of charge carriers. Charge carriers accumulate in the quantum wells of the undepleted portion. The depleted and undepleted regions of the device 100 are clearly labeled in FIG. 2. It should be noted that in the undepleted regions of the device 105 the quantum wells in the conduction band $A_c$ and $B_c$ serve to confine electrons to the narrow band gap layers 104, 106 and the quantum wells in the valence band $A_v$ and $B_v$ serve to confine the holes to the narrow bandgap layers 104,106. There are substantially no charge carriers confined in the narrow band gap layers 108, 110, as the reverse bias voltage has provided a sufficient electric field so that the charge carriers were able to escape from the wells $C_c, D_c, C_v, D_v$.

The width of the depleted region in the multiple quantum well structure 100 depends on the magnitude of the reverse bias voltage. The width of the depletion region may be increased by increasing the reverse bias voltage. The width of the depletion region may be decreased by decreasing the reverse bias voltage. Thus, by varying magnitude of the reverse bias voltage, the number of narrow band gap layers which are depleted of charge or accumulated with charge may be varied.

Figure 3:
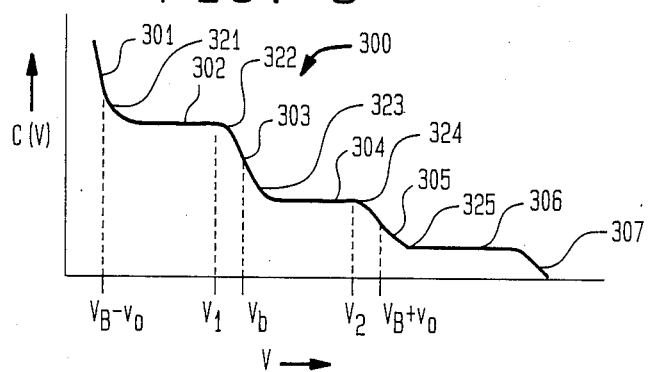
FIG. 3 shows an approximate graph of the capacitance of the quantum well semiconductor device as a function of voltage.

FIG. 3 illustrates an approximate plot 300 of the capacitance C(V) of the multiple quantum well structure of FIG. 1 as a function of reverse bias voltage V applied thereto. The curve 300 is highly nonlinear. When the multiple quantum well structure is incorporated in a frequency multiplier circuit, the highly nonlinear capacitance gives rise to the desired higher order harmonics of the input frequency.

The shape of the nonlinear capacitance curve 300 can be understood from the physics of the multiple quantum well structure. When the reverse bias voltage V is small only a small portion of the wide bandgap layer 111 is depleted. As the reverse bias voltage increases the depleted portion of the wide bandgap layer increases in size and the capacitance decreases roughly like $1/W_{111}$ where $W_{111}$ is the thickness of the depleted portion of the wide bandgap layer 111. The capacitance decreases with the $1/W_{111}$ type behavior until the wide bandgap layer 111 is depleted. This explains the portion 301 of the curve 300.

The narrow bandgap layer 110 cannot be depleted of charge carriers until the electric field produced by the reverse bias voltage is big enough to enable the charge carriers trapped in the quantum wells $D_c, D_v$ to escape therefrom. Thus, the capacitance C(V) is flat until the reverse bias voltage V reaches the value $V_1$. At the voltage $V_1$, the carriers are able to escape from the wells $D_c, D_v$ and the layer 110 is depleted of charge carriers. This explains the relatively flat portion 302 of the curve 300.

As the reverse bias voltage increases from the value $V_1$, the wide bandgap layer 109 starts to become depleted. While, the layer 109 is being depleted, the capacitance varies roughly as $1/W_{109}$ where $W_{109}$ is the thickness of the depleted portion of the wide bandgap layer 109. This explains portion 303 of curve 300.

After layer 109 becomes depleted, the capacitance C(V) levels off as shown in portion 304 of curve 300. The capacitance remains generally constant until the reverse bias voltage V reaches the value $V_2$ at which point the electric field produced by the reverse bias voltage is strong enough to enable the charge carriers to escape from the quantum wells $C_c, C_v$. Thus, when $V = V_2$ the narrow bandgap layer 108 becomes depleted of charge carriers. When the voltage exceeds $V_2$ wide bandgap layer 107 becomes depleted as indicated by portion 305 of curve 300. While layer 107 is being depleted, the capacitance C(V) varies as $1/W_{107}$ where $W_{107}$ is the thickness of the depleted portion of layer 107. A similar analysis explains portions 306 and 307 of the curve 300 which corresponds to the depletion of layers 106 and 105, respectively. As indicated in FIG. 3 for each narrow bandgap layer which is depleted of charge carrier by the reverse bias voltage there is one flat region in the capacitance versus voltage curve 300.

Figure 4:
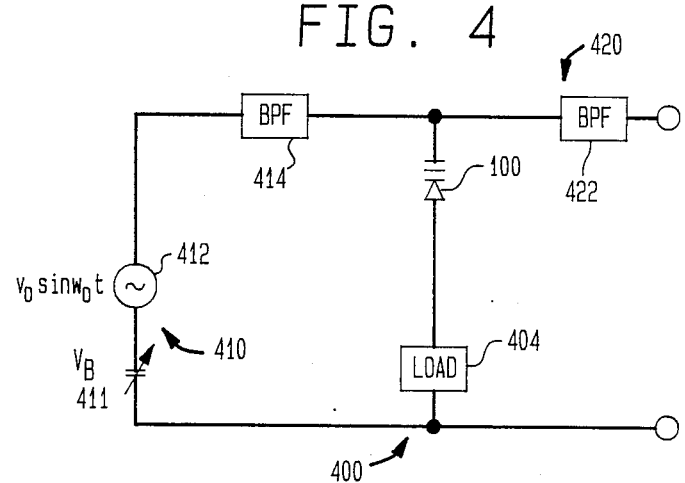
FIG. 4 shows a frequency multiplier circuit incorporating a multiple quantum well device in accordance with an illustrative embodiment of the invention.

Turning to FIG. 4, a frequency multiplier circuit 400 incorporating the multiple quantum well device 100 is illustrated. The multiple quantum well device 100 couples energy from an input circuit 410 which is tuned to an input signal having frequency $\omega_o$ to an output circuit 420 which is tuned to an output frequency which is a particular harmonic of the input frequency $\omega_o$.

The input circuit 410 comprises a D.C. voltage source 411 which produces a D.C. reverse bias voltage $V_B$ and a signal generator 412 which generates a signal of the form $v_o \sin \omega_o t$. Thus the voltage applied to the multiple quantum well device 100 has the form $V = V_B + v_o \sin \omega_o t$. The input circuit also includes a bandpass filter 414 which has a narrow passband centered about the frequency $\omega_o$.

When driven by a signal whose frequency is $\omega_o$, the highly non-linear multiple quantum well structure 100 produces a spectrum of harmonics. However, the frequency of the most prominent harmonic depends on the number of sharp non-linearities in C(V) (i.e. regions of relatively large dC/dV) per cycle of the voltage $V = V_B + v_o \sin \omega_o t$.

More particular, the frequency of the most prominent harmonic is approximately $n\omega_o$ where n is the number of regions of relatively large dC/dV within each cycle of the input voltage. In FIG. 3 the regions of relatively large dC/dV are labeled 321, 322, 323, 324 and 325. If for example $V_B$ and $v_o$ are chosen as shown in FIGS. 3 and 4 then for each cycle of the input voltage $V = V_B + v_o \sin \omega t$ there are eight regions of large dC/dv. Four of these regions occur while V increases from $V_B - v_o$ to $V_B + v_o$ and four occur while V decreases from $V_B + v_o$ to $V_B - v_o$. In this case, the dominant output harmonic is $8\omega_o$. Physically, while V increases from $V_B - v_o$ to $V_B + v_o$, narrow bandgap layers (i.e. quantum wells) are being successively depleted of charge. While V decreases from $V_B + v_o$ to $V_B - v_o$ charge is accumulated in successive narrow bandgap layers.

The number of regions of relatively large dC/dV can easily be changed by changing the amplitude of the signal $v_o$ so that there are fewer or more regions of relatively large dC/dv within each cycle of the input voltage. Thus, the particular higher order harmonic may be chosen by simply adjusting the amplitude of the voltage $v_o$.

Alternatively, the particular higher order harmonic may be chosen by adjusting the amplitude of the reverse bias voltage $V_B$ so that a different number of regions of relatively large dC/dV are included in each cycle. For example if $V_B$ is set to zero, and $v_o$ remains at the same magnitude as in FIG. 2, then the most prominent higher order harmonic will have a frequency of about $4\omega_o$. The reason for this is that during half of each cycle the multiple guantum well structure is forward biased and there is no non-linear dielectric capacitance effect. There are non-linearites in the dielectric capacitance only during the half of each cycle in which the multiple quantum well device is reverse biased.

For given values of the parameters $V_b, v_o$ the number of non-linearites in a cycle of the input voltage depends upon the spacing between the narrow bandgap layers, the doping level and the depth of the quantum wells. There will be larger number of strongly non-linear regions in the C(V) curve for a structure which has a higher density of layers. The reason for this is clear from the curve 300 of FIG. 3.

The output circuit 420 includes a tunable narrow bandpass filter adapted to pass a signal having the frequency of the desired harmonic. The input frequency $\omega_o$ and all other harmonics of the input frequency $\omega_o$ are suppressed by the filter 420. Similarly, the filter 414 prevents harmonics of the input frequency from being transmitted into the input circuit 410.

In the case of a multiple quantum well structure formed in the AlGaAs-GaAs materials system, the layers are typically about 1 Å thick and have dopant densities of about $10^{17}$ cm$^{-3}$ voltages $V_b, v_o$ are on the order 1-3 volts and the input frequencies range from about 400 Hz to about 10 Mhz. Illustratively, a load 404 may be connected to the multiple quantum well device 100.

In some cases, enhancement of the production of higher order harmonics may be enhanced in an embodiment in which a lateral confinement of charge carriers is able to be incorporated in the multiple quantum well semiconductor device. Lateral confinement structures are disclosed in my patent application entitled "Lateral Confinement of Charge Carriers in a Multiple Quantum Well Structure" Ser. No. 06/768,673 filed on Aug. 23, 1986 and assigned to the assignee hereof. This patent application is incorporated herein by reference.

Thus, a frequency multiplier circuit capable of producing higher order harmonics of an input frequency without the use of complex feedback circuitry has been disclosed. It is easy to choose the desired higher order harmonic merely by adjusting the voltages applied the multiple quantum well device incorporated in the frequency multiplier circuit. Finally, the above described embodiments of the inventions are intended to be illustrative only. Numerous alternative embodiments may be devised by those skilled in the art without departing from the scope and spirit of the following claims.

What is claimed is:

1. A frequency multiplier circuit for generating an output signal having an output frequency which is a predetermined harmonic of an input frequency of an input signal, said circuit comprising:
   (a) a semiconductor device;
   (b) input circuit means for applying said input signal to said semiconductor device comprising a signal generator for generating said input signal and a bandpass filter having a narrow pass band centered about said input frequency including means for varying the amplitude of said input signal, said desired harmonic being variable in response to variations in said amplitude;
   (c) output circuit means for enabling detection of said predetermined harmonic of said input signal comprising a narrow bandpass filter for removing undesired harmonic components from said output signal in order to enable detection of said desired harmonic of said input frequency; and
   (d) means for applying a D.C. reverse bias voltage to said semiconductor device and for varying the magnitude of said D.C. reverse bias voltage, said desired harmonic being variable in response to the magnitude of said D.C. reverse bias voltage,
   characterized in that said semiconductor device includes a plurality of relatively narrow bandgap semiconductor layers and a plurality of relatively wide bandgap semiconductor layers composed of $Al_xGa_{1-x}As$, each of said wide bandgap layers and said narrow bandgap layers being interleaved with and contiguous with one another so that said interleaved layers form a quantum well device with highly non-linear operating characteristics.

* * * * *

UNITED STATES PATENT AND TRADEMARK OFFICE
CERTIFICATE OF CORRECTION

PATENT NO. : 4,672,405

DATED : June 9, 1987

INVENTOR(S) : Gustav E. Derkits, Jr.

It is certified that error appears in the above-identified patent and that said Letters Patent is hereby corrected as shown below:

Column 1, line 14, "multiplier" should read --multiplier.--.

Column 2, line 22 "AS" should read --As--.

Column 2, line 61, "FIG. 2," should read --FIG. 2--.

Column 3, line 22, "schottky" should read --Schottky--.

Column 5, line 58, "guantum" should read --quantum--.

Column 5, line 60, "linearites" should read --linearities--.

Column 5, line 64, "linearites" should read --linearities--.

Column 6, line 24, "1986" should read --1985--.

Signed and Sealed this

Twenty-third Day of August, 1988

Attest:

DONALD J. QUIGG

*Attesting Officer*     *Commissioner of Patents and Trademarks*